United States Patent
Lin

(10) Patent No.: US 7,102,195 B2
(45) Date of Patent: Sep. 5, 2006

(54) TRANSISTOR STRUCTURE FOR ELECTROSTATIC DISCHARGE PROTECTION CIRCUIT

(75) Inventor: Shi-Tron Lin, Taipei (TW)

(73) Assignee: Winbond Electronics Corporation, Hsinchu (TW)

( * ) Notice: Subject to any disclaimer, the term of this patent is extended or adjusted under 35 U.S.C. 154(b) by 416 days.

(21) Appl. No.: 09/740,017

(22) Filed: Dec. 20, 2000

(65) Prior Publication Data

US 2002/0074603 A1 Jun. 20, 2002

(51) Int. Cl.
*H01L 23/62* (2006.01)

(52) U.S. Cl. ........................................ 257/355; 257/360
(58) Field of Classification Search ................ 257/355, 257/360

See application file for complete search history.

(56) References Cited

U.S. PATENT DOCUMENTS

| | | |
|---|---|---|
| 5,248,892 A | 9/1993 | Van Roozendaal et al. |
| 5,721,439 A | 2/1998 | Lin |
| 5,742,083 A | 4/1998 | Lin |
| 5,763,919 A | 6/1998 | Lin |
| 6,064,095 A | 5/2000 | Fu |

*Primary Examiner*—Michael Trinh
*Assistant Examiner*—Kiesha Rose
(74) *Attorney, Agent, or Firm*—Finnegan, Henderson, Farabow, Garrett & Dunner, L.L.P.

(57) ABSTRACT

An electrostatic discharge (ESD) protection device includes a semiconductor layer, a source region formed in the layer, a drain region formed in the layer, a channel region in the layer between the source and drain regions, and a gate over the channel region. One or more islands are distributed either symmetrically or non-symmetrically in and along the drain region. The islands can be formed of polysilicon or a field oxide.

22 Claims, 10 Drawing Sheets

TRANSISTOR STRUCTURE FOR ELECTROSTATIC DISCHARGE PROTECTION CIRCUIT

FIELD OF THE INVENTION

1. Field of the Invention

The present invention relates in general to a transistor structure for an electrostatic discharge (ESD) protection circuit and, more particularly, to an ESD protection device having improved performance.

2. Description of the Related Art

Metal oxide semiconductor (MOS) integrated circuits (ICs) receive input signals through the gate of a MOS transistor. If a high voltage input signal is applied to the gate terminal, the gate oxide layer may be unable to withstand the high voltage and break down. Higher than normal input voltages may be produced when semiconductor devices are transported by humans or machines. However, the sources of abnormally high voltages are many. For example, electric charges can be produced by friction between surfaces or when an IC is unpacked from plastic packaging. Static electricity can range from several hundreds volts to several thousand volts. If such high voltages are applied to the pins of an IC package, voltage breakdown of the gate oxide layer of a transistor within the package can occur which would result in the transistor being inoperative. As a result, the entire IC could be rendered inoperative.

To prevent such damages to the MOS transistors, protective circuits are connected to pins of an IC package. Such protective circuits are typically connected between each input/output (I/O) pad and the integrated circuit. The protective circuits are designed to conduct when a high voltage is applied to the I/O pad. Hence, these protective circuits provide an electrical path to, e.g., ground, to safely discharge the high voltage.

As feature sizes of semiconductor IC devices are reduced to the sub-micron level, one of the design rules for making high-speed ICs is to use self-aligned silicide (salicide) fabrication procedures to make MOS transistor components. The goal is to effectively reduce the sheet resistance in the source/drain regions, so that the fabricated MOS transistors operate at higher speeds. However, the use of salicides for high-speed device circuits results in the problem of maintaining adequate ESD protection for such circuits in these IC devices. If the ESD protection circuits are also implemented in the same salicide fabrication technology, then the sheet resistance in the N+ diffusion regions for the ESD protection circuits will fall from the traditional range of about 60 Ω per-square for effective protection to about 2–3 Ω per-square.

FIG. 1 is a reproduction of FIG. 8 of U.S. Pat. No. 5,721,439 which illustrates a portion of an ESD device. The illustrated ESD device can be fabricated by a salicide process while providing an effective sheet resistance that provides ESD protection. With reference to FIG. 1, a number of isolated islands 81–86 of equal length are arranged in multiple rows in a drain region 87 and a source region 88 on opposite sides of a gate 80. The islands 81–86 consist of either a field oxide or polysilicon. The islands are arranged in a relative interleaving relationship with islands in the neighboring rows to either side.

While the symmetrical arrangement of islands such as illustrated in FIG. 1 improves ESD performance, it decreases the design freedom in constructing ESD devices. For a particular combination of island length, gap, and transistor width, it may be difficult to achieve a symmetrical layout design.

SUMMARY OF THE INVENTION

Accordingly, the present invention is directed to an ESD protection device that substantially obviates one or more problems due to limitations and disadvantages of the related art.

Additional features and advantages of the invention will be set forth in the description which follows, and in part will be apparent from the description, or may be learned by practice of the invention. The objectives and advantages of the invention will be realized and attained by means of the elements and combinations particularly pointed out in the written description and claims hereof, as well as the appended drawings. To achieve these and other advantages and in accordance with the purpose of the invention, as embodied and broadly described, the invention is directed to an electrostatic discharge (ESD) protection device, comprising: a semiconductor layer; a first diffusion region formed in the layer; a second diffusion region formed in the layer adjacent to and spaced from the first diffusion region; and at least one island formed along a length direction of the first diffusion region, the at least one island positioned non-symmetrically along the length direction.

Also in accordance with the invention, there is provided an electrostatic discharge (ESD) protection device, comprising: a semiconductor layer; a first diffusion region formed in the layer; a second diffusion region formed in the layer and spaced from the first diffusion region; a single island formed along a length direction of the first diffusion region and being symmetrically positioned along the length direction relative to edges of the first diffusion region.

Additionally in accordance with the invention, there is provided an electrostatic discharge (ESD) protection device, comprising: a semiconductor layer; a first diffusion region formed in the layer; a second diffusion region formed in the layer and spaced from the first diffusion region; an island generally extending across a length direction of the first diffusion region, the island comprising a plurality of island portions, proximate ends of adjacent island portions forming a predetermined angle.

Additionally in accordance with the invention, there is provided an electrostatic discharge (ESD) protection device, comprising: a semiconductor layer; a first heavily doped region in the layer; a second heavily doped region in the layer; a channel region formed between the first and second heavily doped regions; at least one island formed along a length direction of the first heavily doped region; and the at least one island having a length greater than 50% of a longitudinal dimension of the channel region so that the least one island increases a lateral resistance of the first heavily doped region for improving ESD immunity.

Also in accordance with the invention, there is provided an ESD protection device coupled between an anode and a cathode comprising: a semiconductor layer; a first heavily doped region in the layer; a second heavily doped region in the layer; a channel region formed between the first and second heavily doped regions; and at least one polysilicon island formed along a length direction of the first heavily doped region, said at least one island being coupled to a node.

Further in accordance with the invention, there is provided an electrostatic discharge (ESD) protection device, comprising: a semiconductor layer; a first diffusion region formed in the layer; a second diffusion region formed in the layer; a channel region in the layer between the first and second diffusion regions; a gate formed over the channel region; a first island formed in the first diffusion region in contact with the gate and at a first predetermined angle thereto; and a second island formed in the first diffusion region in contact with the first island.

Additionally in accordance with the invention, there is provided an electrostatic discharge (ESD) protection device, comprising: a semiconductor layer; a first diffusion region formed in the layer; a second diffusion region formed in the layer and spaced from the first diffusion region; an island formed along a length direction of the first diffusion region, the island comprising an array of small islands.

Yet further in accordance with the invention, there is provided an electrostatic discharge (ESD) protection device, comprising: a semiconductor layer; a first diffusion region formed in the layer; a second diffusion region formed in the layer and spaced from the first diffusion region; an island formed along a length direction of the first diffusion region, the island comprising a group of distributed small islands.

Also in accordance with the invention, there is provided a method of making an electrostatic discharge (ESD) protection device, comprising the steps of: providing a semiconductor layer; forming a first diffusion region in the layer; forming a second diffusion region in the layer adjacent to and spaced from the first diffusion region; and forming at least one island along a length direction of the first diffusion region, to be one of symmetrically and non-symmetrically positioned along the length direction.

It is to be understood that both the foregoing general description and the following detailed description are exemplary and explanatory only and are not restrictive of the invention, as claimed.

The accompanying drawings are included to provide a further understanding of the invention and are incorporated in and constitute a part of this specification, illustrate embodiments of the invention, and together with the description serve to explain principles of the invention.

DETAILED DESCRIPTION OF THE PREFERRED EMBODIMENT

Figure 1:
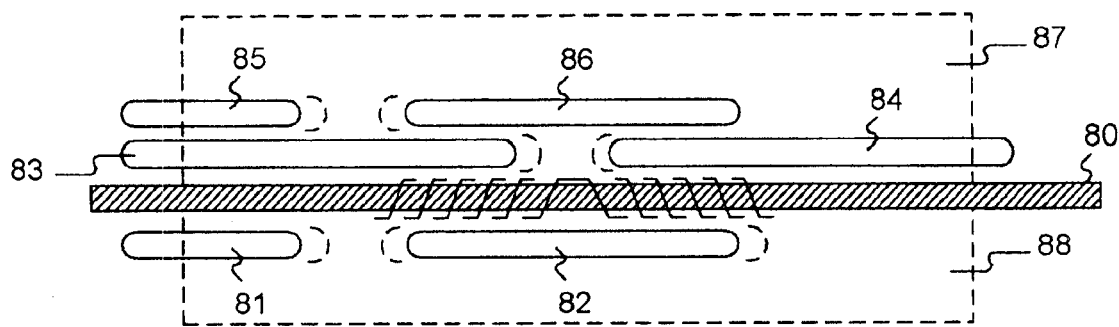
FIG. 1 illustrates a portion of a prior art ESD protection device.
Figure 2A:
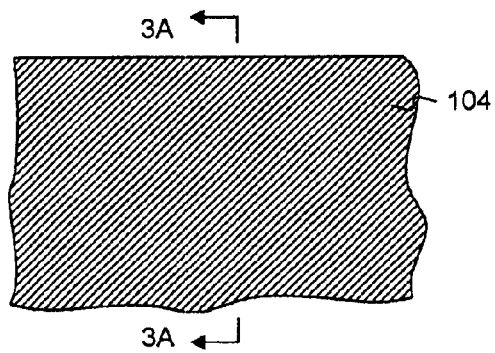
FIGS. 2A–2C illustrate plan views of an ESD protection device according to a first embodiment of the present invention.
Figure 3A:
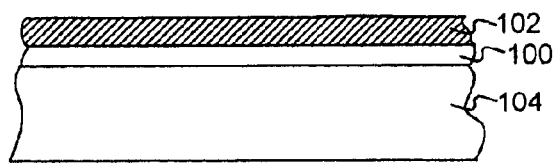
FIGS. 3A–3C illustrate cross-sectional views of the ESD protection device shown in FIGS. 2A–2C, respectively.
Figure 2B:
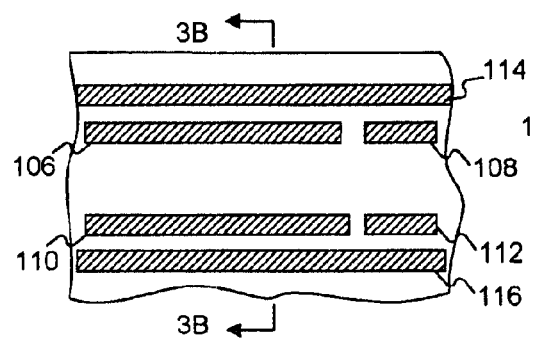
Figure 3B:
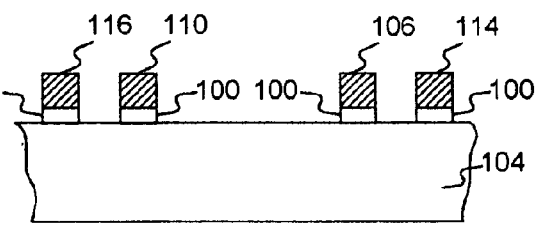
Figure 2C:
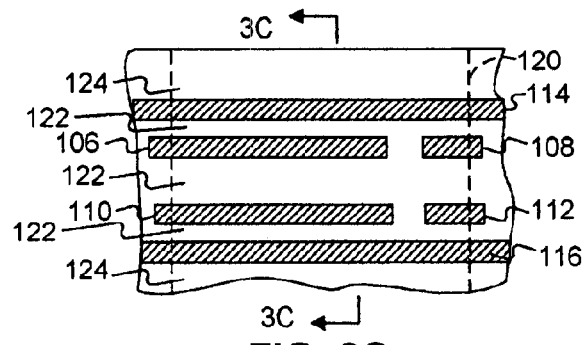
Figure 3C:
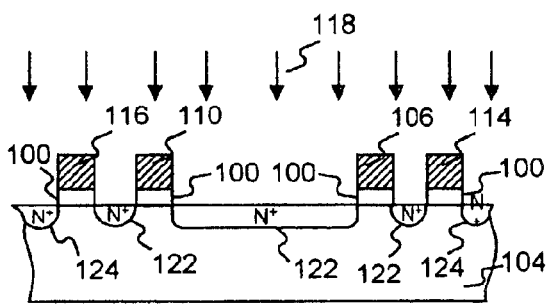

FIGS. 2A–2C and 3A–3C illustrate a first embodiment of the invention. FIGS. 2A–2C show a plan view of an ESD protection device according to the first embodiment at selected stages of fabrication. FIGS. 3A–3C show cross-sectional views of the ESD device respectively corresponding to FIGS. 2A–2C. With reference to FIGS. 2A and 3A, the process for fabricating the ESD device begins with forming, in succession, an oxide layer 100 and a polysilicon layer 102 on a p-type silicon substrate 104. Subsequently, as shown in FIGS. 2B and 3B, a photolithography process is used to form polysilicon islands 106, 108, 110, and 112 and polysilicon gates 114 and 116. Then, as shown in FIGS. 2C and 3C, an ion implantation 118 is performed to form an N+ diffusion region 120 which includes N+ drain diffusion regions 122 and N+ source diffusion regions 124.

As seen in FIGS. 2B and 2C, polysilicon islands 106 and 108 are positioned in and along a length direction of drain region 122 and are substantially parallel to gate 114. Similarly, polysilicon islands 110 and 112 are positioned in and along the length direction of drain region 122 and are substantially parallel to gate 116. Polysilicon islands 106 and 108 adjacent gate 114 are of unequal length with island 106 being substantially longer than island 108. Further, the length of island 106 is more than 50% of the length of drain region 122. Islands 110 and 112 have lengths substantially equal to islands 106 and 108, respectively. As a result, the gap between islands 106 and 108 and the gap between islands 110 and 112 are positioned toward a right edge of diffusion region 120, as viewed in FIG. 2C.

Further, islands 106 and 110 have the same position relative to a left edge of diffusion region 120, as viewed in FIG. 2C, with each of islands 106 and 110 extending over the left edge of diffusion region 120. Similarly, islands 108 and 112 have the same position relative to the right edge of diffusion region 120, with each of islands 108 and 112 extending over the right edge of diffusion region 120.

Polysilicon islands 106, 108, 110, and 112 constitute an arrangement of islands of an ESD device consistent with the present invention which provides improved operating performance of the ESD device as more fully described below.

The steps illustrated in FIGS. 2A–2C and 3A–3C for fabricating the ESD device of the first embodiment are fully compatible with the steps for fabricating a CMOS based IC device using silicide diffusion or salicide process technology. As a result, no additional fabrication steps are introduced into the process for forming the IC device in order to also form the ESD device of the first embodiment.

Figure 4A:
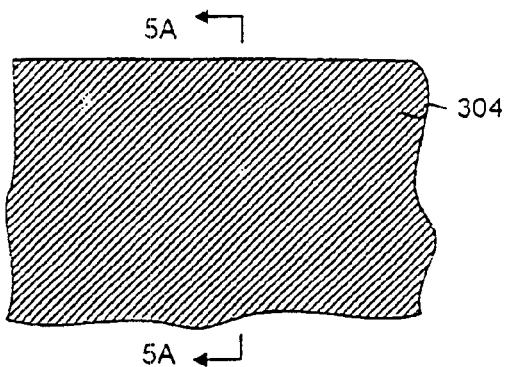
FIGS. 4A–4C illustrate plan views of an ESD protection device according to a second embodiment of the present invention.
Figure 5A:
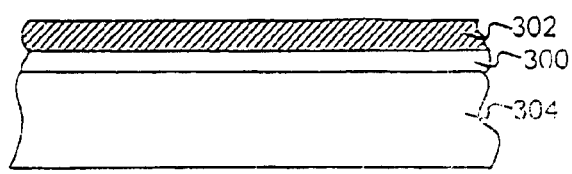
FIGS. 5A–5C illustrate cross-sectional views of the ESD protection device illustrated in FIGS. 4A–4C, respectively.
Figure 4B:
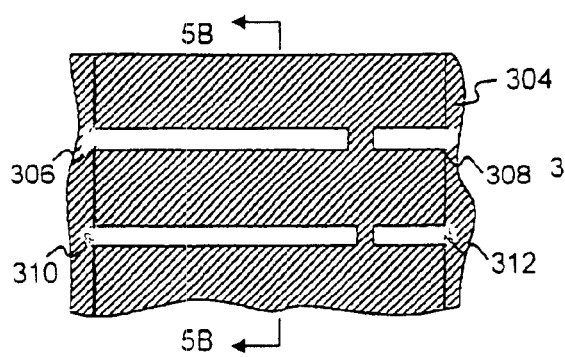
Figure 5B:
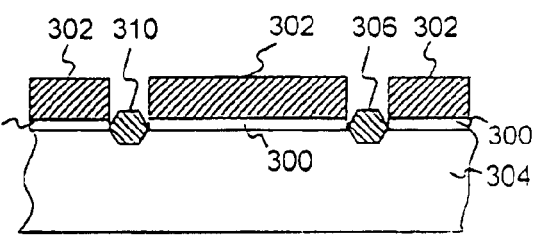
Figure 4C:
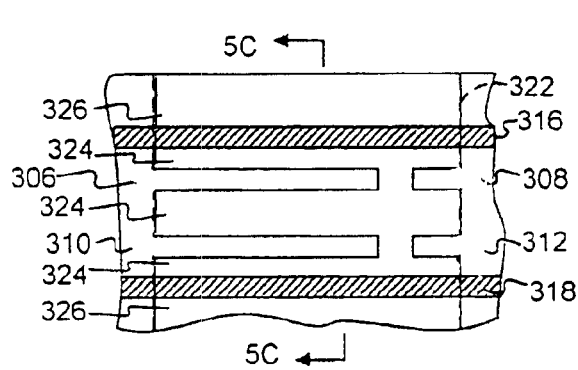
Figure 5C:
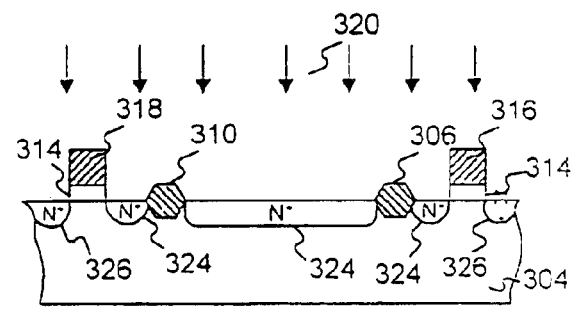

FIGS. 4A–4C and 5A–5C illustrate a second embodiment of the invention. FIGS. 4A–4C illustrate a plan view of an ESD protection device according to the second embodiment at selected stages of fabrication, while FIGS. 5A–5C illustrate cross-sectional views of the ESD device respectively corresponding to FIGS. 4A–4C. With reference to FIGS. 4A and 5A, the process for fabricating the ESD device begins with forming, in succession, an oxide layer 300 and a nitride layer 302 on a p-type silicon substrate 304. Next, as shown in FIGS. 4B and 5B, a photolithography process is used to form field oxide islands by first etching away areas of nitride layer 302 and oxide layer 300 to expose selected regions of substrate 304 where the field oxide islands will be formed. Field oxide islands 306, 308, 310, and 312 are then formed on substrate 304 in the selected regions by a process such as LOCOS (local oxidation of silicon).

As shown in FIGS. 4C and 5C, oxide layer 300 and nitride layer 302 shown in FIG. 5B are removed by etching. Next, a gate oxide layer 314 and gates 316 and 318 are formed by a photolithography process. Then an ion implantation 320 is performed to form an N+ diffusion region 322 which includes N+ drain diffusion regions 324 and N+ source diffusion regions 326.

Field oxide islands 306, 308, 310, and 312 have relative lengths and are arranged with respect to gates 316 and 318 substantially the same as islands 106, 108, 110, and 112, respectively. Islands 306, 308, 310, and 312 constitute another arrangement of islands of an ESD device consistent with the present invention which provide improved performance of the ESD device.

Figure 6:
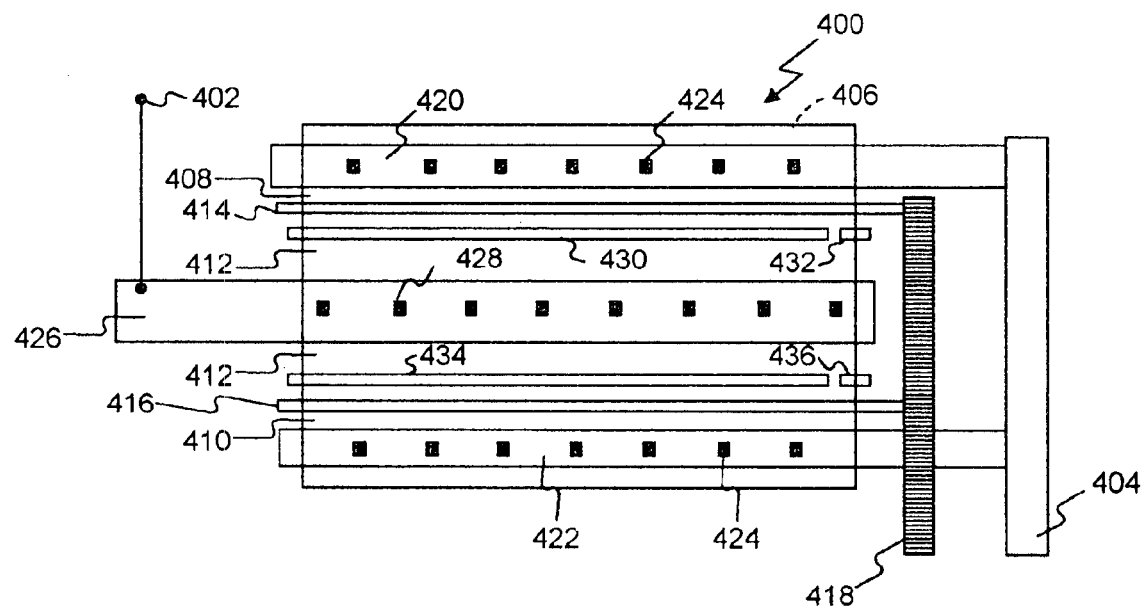
FIG. 6 illustrates an ESD protection device implemented as a MOSFET.

FIG. 6 illustrates an ESD device 400 implemented as a MOSFET and embodying the arrangement of islands along the drain diffusion regions according to the first and second embodiments of the invention. With reference to FIG. 6, device 400 is connected between an anode 402 and a cathode 404. Anode 402 can comprise or be coupled to an input, output, I/O pad or first power bus. Cathode 404 can comprise or be coupled to a second power bus, including ground or a circuit reference bus. An active region 406 within which device 400 is formed includes N+ source diffusion regions 408 and 410 and N+ drain diffusion regions 412. Preferably, a field oxide surrounds region 406, so that region 406 defines boundaries of an active region, which includes the source and drain diffusion regions and gate regions. Gates 414 and 416 extend across region 406 from a common gate bus 418. Gates 414 and 416 are respectively disposed over channel regions between the proximate source and drain regions. Overlying metal buses 420 and 422 extend from cathode 404, overlie source regions 408 and 410, respectively, and are connected to the source regions by contacts 424. A metal bus 426 is connected to anode 402, overlies drain region 412 and is connected to the drain region by contacts 428.

Device 400 includes islands 430 and 432 positioned in and along the length of drain region 412 adjacent gate 414. Similarly, islands 434 and 436 are positioned in and along the length of drain region 412 adjacent gate 416. Islands 430, 432, 434, and 436 can be implemented as polysilicon islands or field oxide islands as described above for the first and second embodiments of the invention, respectively. Also, islands 430, 432, 434, and 436 have relative lengths and are arranged with respect to gates 414 and 416 substantially the same as the islands of the first and second embodiments described above. Thus, the length of each of islands 430 and 434 is greater than 50% of the length of each channel region.

Figure 7:
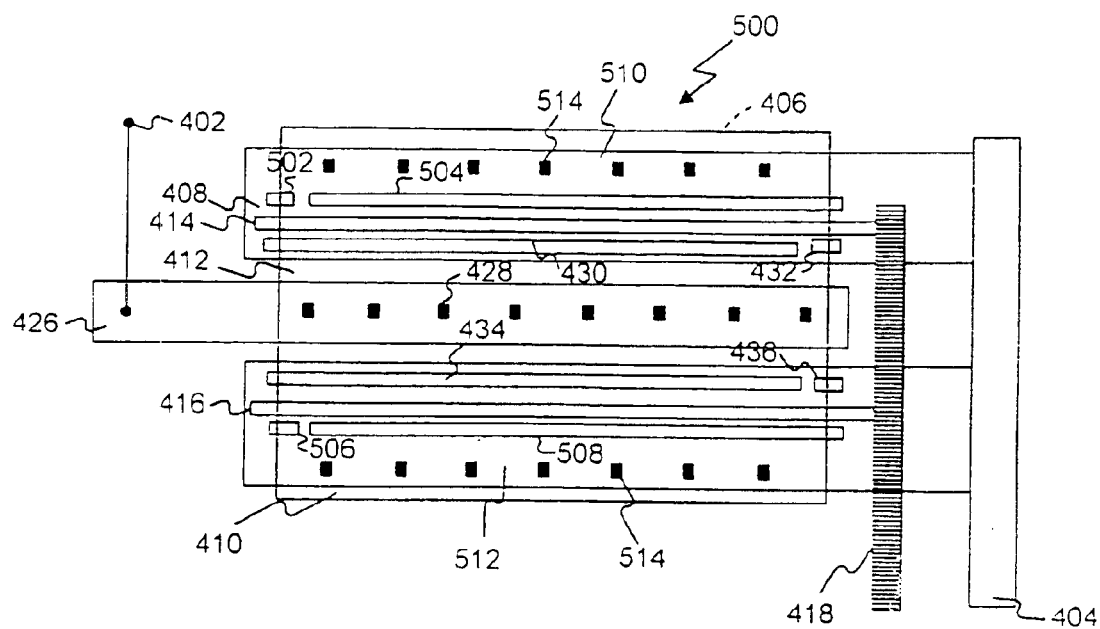
FIG. 7 illustrates an ESD protection device constructed according to a third embodiment of the present invention.

FIG. 7 illustrates an ESD device 500 constructed according to a third embodiment of the present invention. In the figures illustrating the third and subsequent embodiments, features that have the same function as corresponding features in FIG. 6 are labeled with like reference numerals and are thus not again described in detail. With reference to FIG. 7, device 500 includes islands 502 and 504 positioned in and along the length of source region 408 and islands 506 and 508 positioned in and along the length of source region 410. Islands 502 and 504 are substantially parallel to gate 414 and islands 506 and 508 are substantially parallel to gate 416. Island 504 is substantially longer than island 502 and island 508 is substantially longer than island 506. As a result, the gap between islands 502 and 504 and the gap between islands 506 and 508 are positioned toward a left edge of region 406, as viewed in FIG. 7. Further, remote ends of islands 502 and 504 extend beyond the left and right edges, respectively, of region 406. Similarly, remote ends of islands 506 and 508 extend beyond the left and right edges, respectively, of region 406. Additionally, the gap between islands 502 and 504 is located near the edge of region 406 opposite the edge near which the gap between islands 430 and 432 is located. The gap between islands 506 and 508 is similarly arranged relative to the gap between islands 434 and 436.

A metal bus 510 extending from cathode 404 overlies islands 502, 504, 430, and 432. A metal bus 512 extending from cathode 404 overlies islands 506, 508, 434, and 436. Buses 510 and 512 are connected to source regions 408 and 410, respectively, by contacts 514. All of the islands can be provided as polysilicon islands or field oxide islands by means of the fabrication processes disclosed for the first or second embodiments, respectively. In the case where the islands in the source and drain diffusion regions are polysilicon, the overlying buses 510 and 512 can be used to stabilize the potential of the islands. Such stabilization is achieved by a shielding effect and capacitive coupling.

Figure 8:
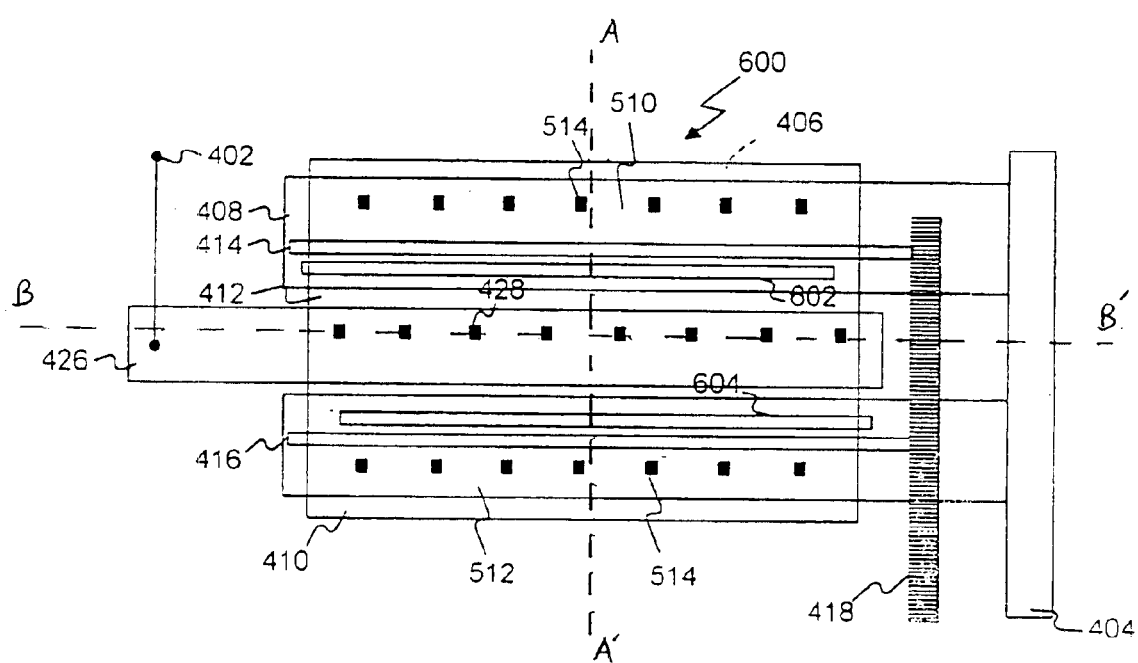
FIG. 8 illustrates an ESD protection device constructed according to a fourth embodiment of the present invention.

FIG. 8 illustrates an ESD device 600 constructed according to a fourth embodiment of the present invention. With reference to FIG. 8, device 600 includes a single island 602 in and along drain region 412 and adjacent gate 414, and a single island 602 in and along drain region 412 and adjacent gate 416. The left end of island 602 extends beyond the left edge of region 406 while the right end of island proximate the right edge of region 406 but within region 406. Island 604 is non- symmetrically disposed relative to island 602 in that the right end of island 604 extends beyond the right edge of region 406 while the left end of island 604 is within region 406. Thus, islands 602 and 604 are non-symmetric about axis A-A' and axis B-B' .

Figure 9:
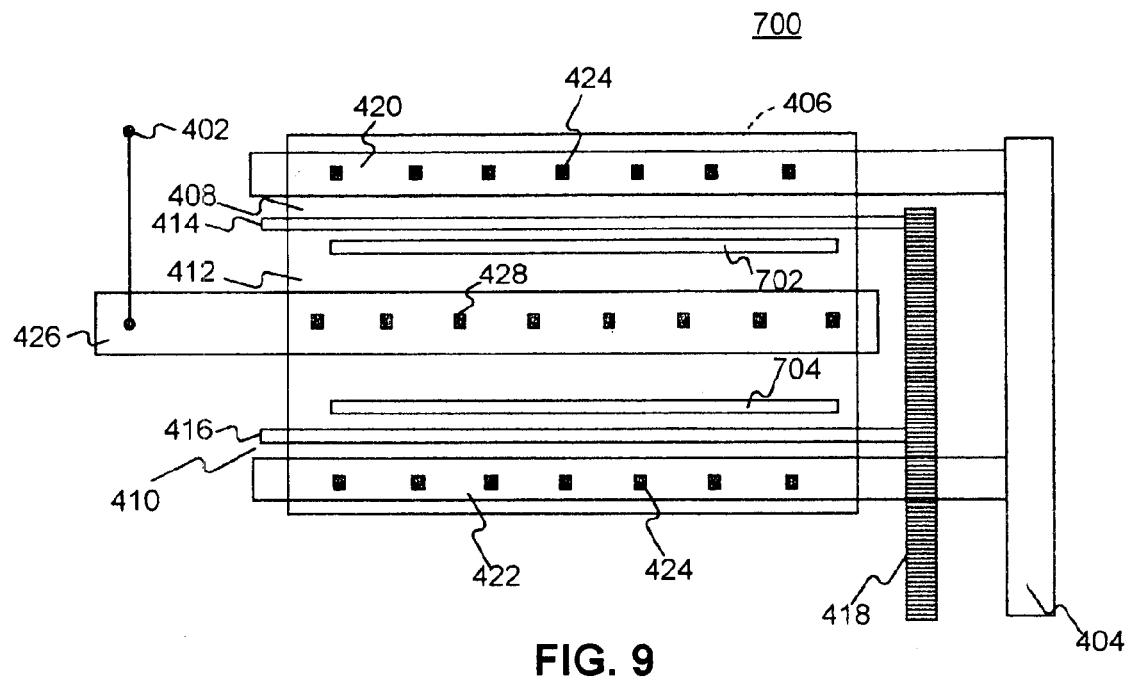
FIG. 9 illustrates an ESD protection device constructed according to a fifth embodiment of the present invention.

FIG. 9 illustrates an ESD device 700 constructed according to a fifth embodiment of the present invention. With reference to FIG. 9, device 700 includes a single island 702 in and along drain region 412 adjacent gate 414 and a single island 704 in and along drain region 412 adjacent gate 416. Both of islands 702 and 704 are symmetrically disposed within region 406 with their respective left and right ends approximately equidistant from the left and right edges, respectively, of region 406.

Figure 10:
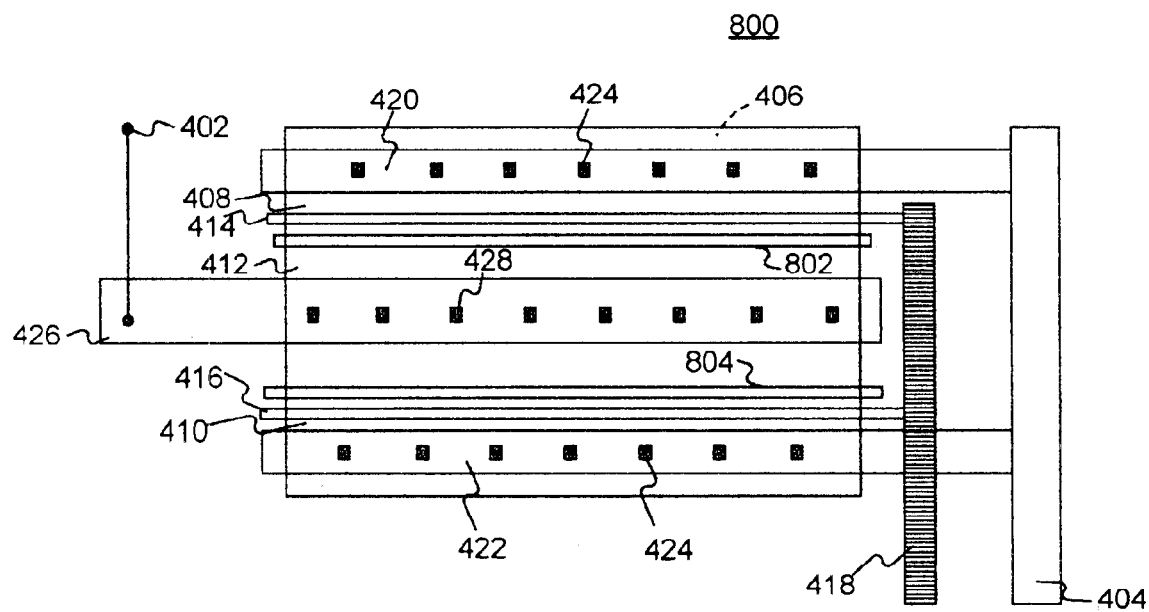
FIG. 10 illustrates an ESD protection device constructed according to a sixth embodiment of the present invention.

FIG. 10 illustrates an ESD device 800 constructed according to a sixth embodiment of the present invention. With reference to FIG. 10, device 800 includes a single island 802 in and along drain region 412 adjacent gate 414 and a single island 804 in and along drain region 412 adjacent gate 416. Both of islands 802 and 804 are symmetrically disposed relative to the left and right edges of region 406. In particular, the left and right ends of islands 802 and 804 extend beyond the left and right edges of diffusion region 406 by approximately the same distance.

Figure 11:
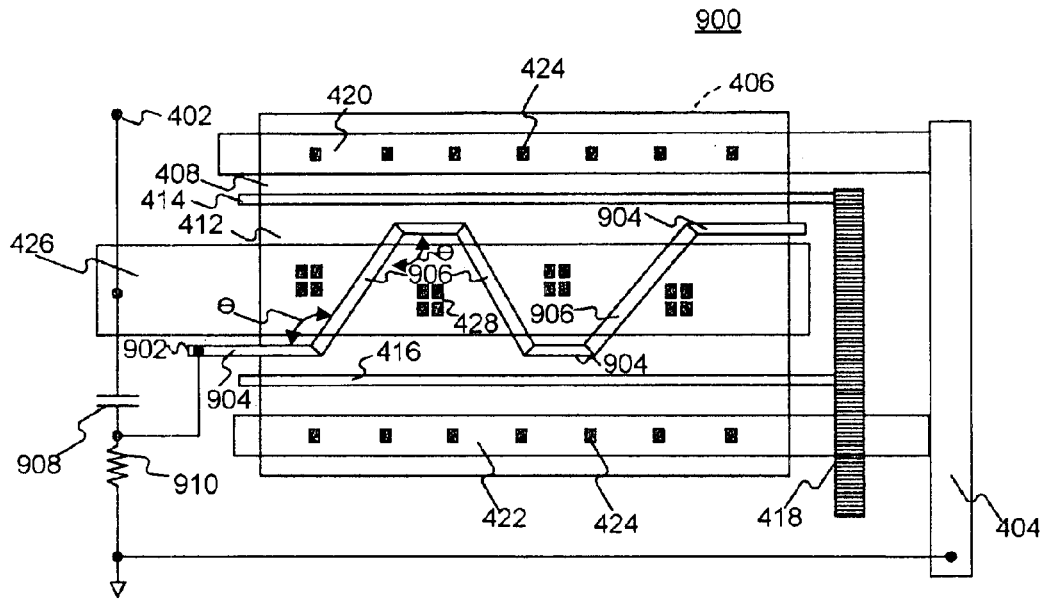
FIG. 11 illustrates an ESD protection device constructed according to a seventh embodiment of the present invention.

FIG. 11 illustrates an ESD device 900 constructed according to a seventh embodiment of the invention. With reference to FIG. 11, device 900 includes an island 902 generally extending across the length direction of drain region 412. Island 902 consists of island portions 904 and 906. Portions 904 are substantially parallel to gates 414 and 416 and, thus, to the length direction of drain region 412. Each of portions 906 is skewed relative to the length direction of drain region 412 to form a predetermined angle θ with each of the proximate preceding and successive portions 904. In FIG. 11, the value of θ is preferably in the range of 90° to 150°. Thus, island 902 has a zigzag configuration across the length of drain region 412.

Island 902 can be fabricated so that its respective ends do not extend beyond the edge of drain diffusion region 412, or that either or both ends extend beyond the drain diffusion region onto the adjacent field oxide layer.

Optionally, in the case that island 902 is fabricated with polysilicon, device 900 can be coupled to circuitry to raise the potential of island 902 during an ESD event. With reference to FIG. 11, such optional circuitry includes a capacitor 908 coupled between anode 402 and one end of island 902 or a resistor 910 coupled between cathode 404 and the end of island 902 or both of capacitor 908 and resistor 910.

Further, optional circuitry such as capacitor 908 and resistor 910 can be coupled to one or more polysilicon islands of any embodiment illustrated herein to raise island potential during an ESD event.

Figure 12:
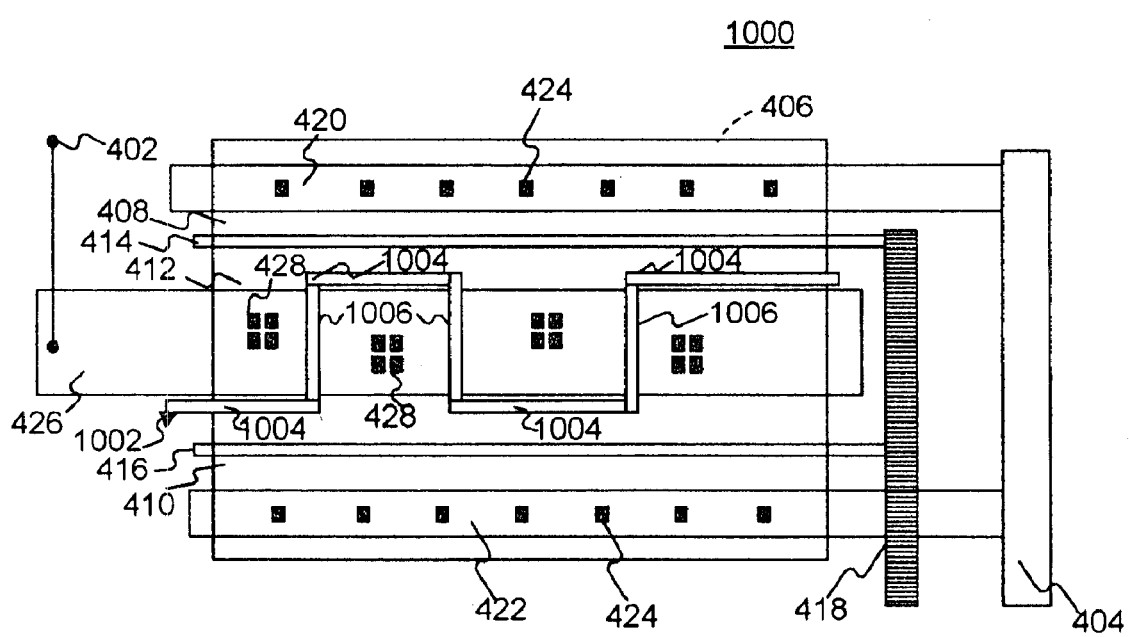
FIG. 12 illustrates an ESD protection device constructed according to a eighth embodiment of the present invention.

FIG. 12 illustrates an ESD device 1000 constructed according to an eighth embodiment of the invention. With reference to FIG. 12, device 1000 includes an island 1002 generally extending across the length direction of drain region 412. Island 1002 consists of island portions 1004 and 1006. Portions 1004 are substantially parallel to gates 414 and 416 and, thus, to the length direction of drain region 412. Each of portions 1006 forms an approximately 90° angle with each of the proximate preceding and successive portions 1004. As in the case of ESD device 900, either or both of the ends of island 1002 can terminate within or extend beyond the edges of drain diffusion region 412.

In each of the fourth through eighth embodiments described above, the islands can be provided as polysilicon islands or field oxide islands by means of the fabrication processes disclosed for the first or second embodiments, respectively.

Figure 13A:
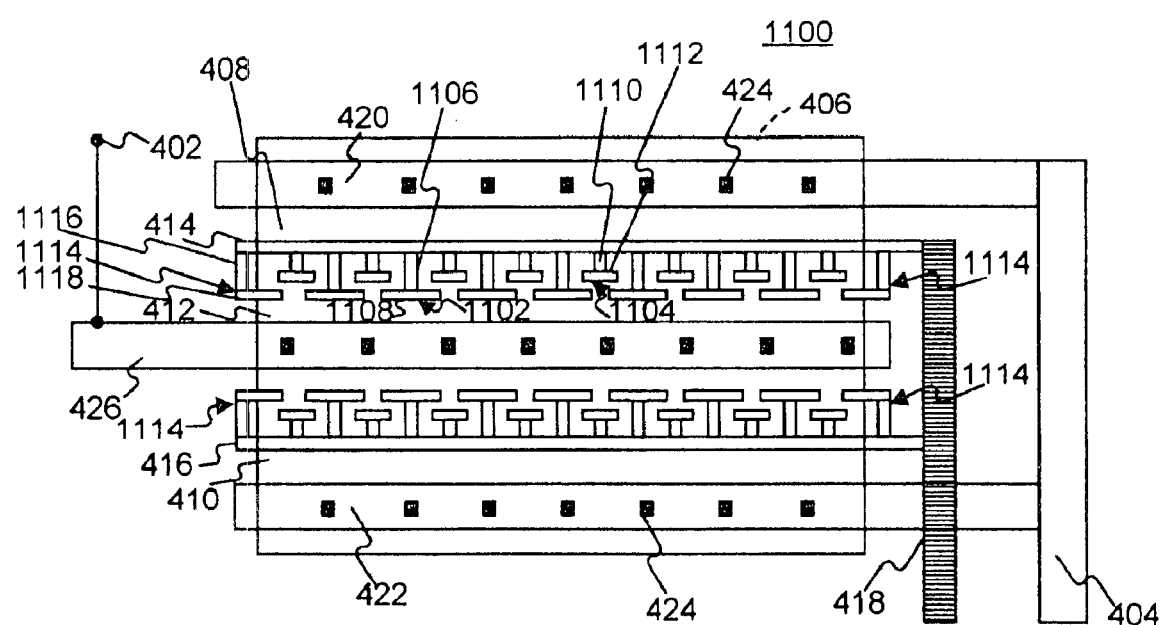
FIG. 13A illustrates an ESD protection device constructed according to a ninth embodiment of the present invention.

FIG. 13A illustrates an ESD device 1100 constructed according to a ninth embodiment of the invention. With reference to FIG. 13, device 1100 includes a plurality of first islands 1102 alternately arranged with second islands 1104 formed in and along drain diffusion field 412. Each first island 1102 includes a vertical island portion 1106 and a horizontal island portion 1108, and each second island 1104 includes a vertical island portion 1110 and a horizontal island portion 1112. The terms "vertical" and "horizontal" are only used for descriptive purposes with respect to the orientation of the island portions relative to gates 414 and 416 as illustrated in FIG. 13A. In the illustrated embodiment, each vertical portion 1106 and 1110 is physically connected to and substantially perpendicular to its associated gate, while each horizontal portion 1108 or 1112 is substantially parallel to its associated gate and forms a "T" configuration with its associated vertical portion 1106 or 1110, respectively. Further, each vertical portion 1106 is longer than each vertical portion 1110. This facilitates alternating the arrangement of first islands 1102 and second islands 1104, with horizontal portions 1108 of consecutive first islands 1102 extending over horizontal portion 1112 of the second island 1104 positioned therebetween.

ESD device 1100 also includes four islands 1114 respectively physically connected near the ends of each of gates 414 and 416. Each of islands 1114 includes vertical island portion 1116 physically connected to its associated gate 414 or 416 and a horizontal island portion 1118. Respective ends of portions 1116 and 1118 are connected to form an "L" configuration with the free end of horizontal portion 1118 directed inward toward drain diffusion region 412. Further, each vertical portion 1116 is formed outside region 406 while each horizontal portion 1118 bridges the edge of region 406.

The vertical portions, i.e., portions 1106, 1110, and 1116, and the horizontal portions, i.e., portions 1108, 1112, and 1118, are both preferably formed of polysilicon, however, they can be respectively formed of polysilicon and field oxide, field oxide and polysilicon, or field oxide and field oxide. In an alternative construction, all vertical portions are formed of polysilicon, horizontal portions 1112 are formed of polysilicon, and horizontal portions 1108 and 1118 are formed of field oxide. In another alternative construction, vertical portions 1106, 1110, and 1116 and horizontal portions 1108, 1112, and 1118 can be formed at arbitrary angles relative to each other and to gates 414 and 416.

Figure 13B:
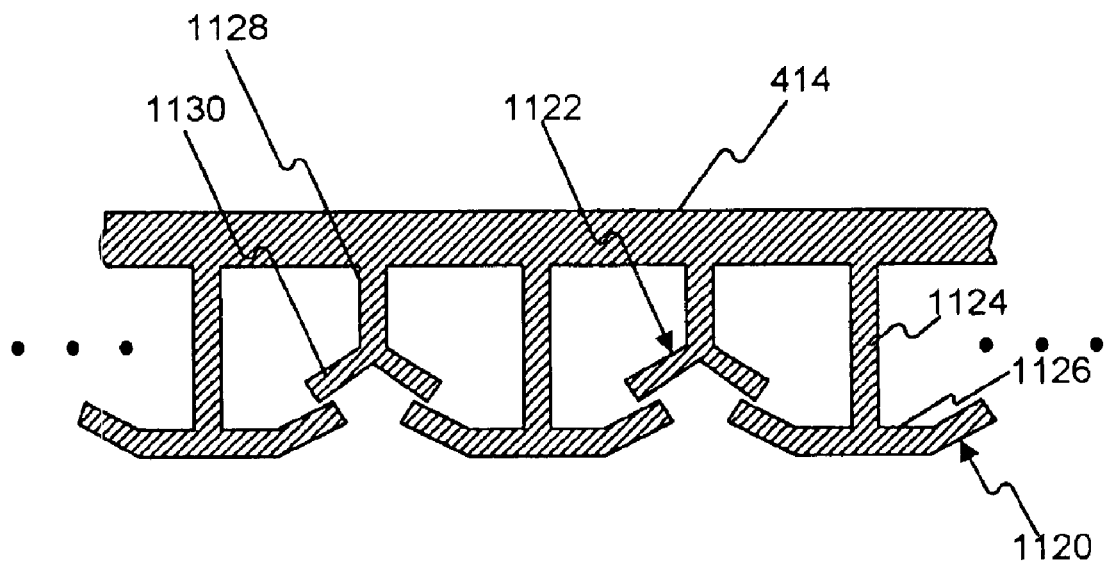
FIG. 13B illustrates island portions having a dendritic structure.

Additionally, with respect to any of the above described alternatives for implementing an ESD device according to the ninth embodiment of the invention, the individual island portions need not have a rectangular bar-like shape, as shown in FIG. 13A and can, instead, have an arbitrarily-shaped dendritic structure shown in FIG. 13B. As used herein, the term "dendritic" connotes a branching structure. FIG. 13B illustrates a portion of gate 414 with dendritic islands 1120 and 1122 connected thereto. Islands 1120 and 1122 are alternately arranged along each of gates 414 and 416 in the same manner as islands 1102 and 1104 are alternately arranged. Each island 1120 includes a vertical portion 1124 and a horizontal portion 1126. Remote ends of each horizontal portion 1126 are bent toward gate 414. Each island 1122 includes a vertical portion 1128 that terminates with two extension portions 1130 that form a "Y" configuration with portion 1128. Each vertical portion 1124 is longer than each vertical portion 1128 to facilitate the alternating arrangement of islands 1120 and 1122.

Figure 14:
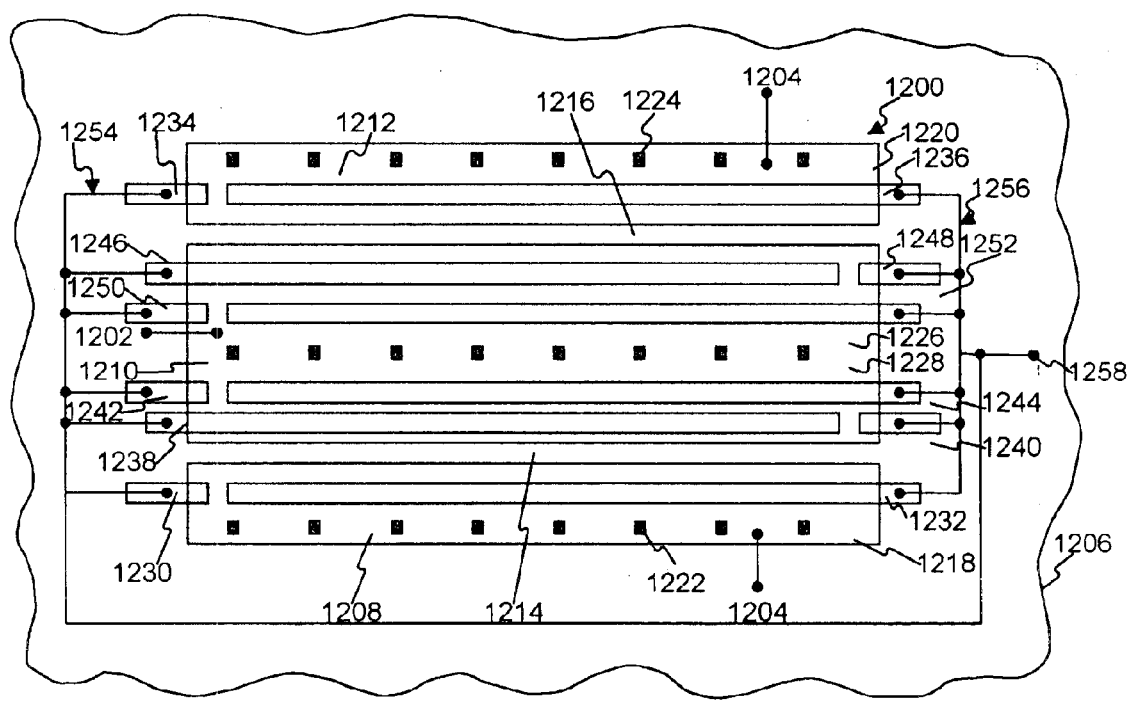
FIG. 14 illustrates an ESD protection device constructed according to a tenth embodiment of the present invention.

FIG. 14 illustrates an ESD device 1200 according to a tenth embodiment of the invention. With reference to FIG. 14, ESD device 1200 is connected between an anode 1202 and a cathode 1204. N+ diffusion regions 1208, 1210, and 1212 are formed in a p-type substrate 1206. A strip of field oxide 1214 separates diffusion regions 1208 and 1210 and a strip of field oxide 1216 separates diffusion regions 1210 and 1212. Overlying metal buses 1218 and 1220 overlie diffusion regions 1208 and 1212 and are connected thereto by contacts 1222 and 1224, respectively. An overlying metal bus 1226 overlies diffusion region 1210 and is connected thereto by contacts 1228. Anode 1202 is connected to bus 1226 and cathode 1204 is connected to buses 1218 and 1220.

Device 1200 includes islands 1230 and 1232 positioned in and along the length of diffusion region 1208 and substantially parallel to oxide strip 1214. Islands 1234 and 1236 are positioned in and along the length of diffusion region 1212 and are substantially parallel to oxide strip 1216. Islands 1238, 1240, 1242, and 1244 are positioned in and along the length of diffusion region 1210 and are adjacent and substantially parallel to oxide strip 1214. Islands 1246, 1248, 1250, and 1252 are positioned in and along the length of diffusion region 1210 and are adjacent and substantially parallel to oxide strip 1216. Islands 1238–1252 can be formed as polysilicon or field oxide islands as described above for the first and second embodiments.

Islands 1238–1252 have the relative lengths generally shown in FIG. 14 and are all disposed underneath overlying metal buses 1218, 1220, and 1226. The ends of islands 1230, 1234, 1238, 1242, 1246, and 1250 extending outwardly are connected together by connections 1254. Similarly, the outwardly extending ends of islands 1232, 1236, 1240, 1244, 1248, and 1252 are connected together by connections 1256. Connections 1254 and 1256 are connected together at a coupling 1258.

In the operation of an ESD device consistent with embodiments of the present invention, current flow through the source and drain diffusion regions is dispersed by the islands. Such dispersal increases the effective sheet resistance in the diffusion regions so that higher ESD voltages can be withstood. An additional mechanism by which the islands in the drain region improve ESD performance is due to those islands being capacitively coupled to the drain region when the drain potential is raised to 8 volts or more during an ESD event, while the islands in the source region are resistively coupled thereto. As a result, additional ESD current may flow underneath the islands, in addition to flowing through the gaps between the islands.

Additionally, device 1200 can operate as a bipolar device during an ESD event. In this regard, device 1200 operates substantially in the same way as a grounded gate MOS ESD device. The drain and source respectively correspond to a collector and emitter and there is no conductor therebetween during normal operation. However, upon occurrence of an ESD event, high voltage causes the drain junction with the p-substrate 1206 to break down, while carriers flowing in the substrate cause the source junction with the p-substrate 1206 to be forward biased to inject more carriers. In this manner, bipolar operation is triggered by the ESD event.

With respect to those embodiments providing non-symmetric positioning of the gaps between islands, e.g., as shown in devices 400, 500, and 1200, the gap position may increase the probability that the gap is positioned away from the weakest point along the gate oxide edge. The gate-oxide edge weakness point is where ESD current constriction occurs and eventually causes damage to the gate oxide during or at a later stage of an ESD event. The cause may be due to a microscopic non-uniformity of the gate oxide edge structure. For example, there is a 50% chance that the gap between islands is along one-half the gate length, while the gate-oxide-edge weakness is along the other half of the gate length. Therefore, positioning the gap between islands not at the center of the diffusion region or gate length dimension, but towards one end of that dimension as shown in FIGS. 2C, 4C, 6, and 7 has the advantage of a higher probability of the gap being positioned away from a possible gate-oxide edge weakness.

Actual testing was conducted for an ESD device constructed according to the embodiment shown in FIG. 6. A first test device was formed using a 0.25 CMOS salicide process technology with polysilicon islands each about 0.5 μm wide and separated from the proximate polysilicon gate by approximately 0.5 μm. The length of each gate was about 20 μm and the gap between islands, e.g., between islands 430 and 432, was approximately 1.5 μm. Under these conditions, with a voltage applied according to Human Body Model ESD testing, ESD performance was in the range of 3.75 to 4.25 KV, as compared with approximately 2.5 KV for a similar structure without islands. Actual testing was also performed on a second test device constructed according to the embodiment shown in FIG. 7, i.e., also including islands in the source diffusion region. The second test device included polysilicon islands and the same dimensions as the first test device and exhibited ESD performance in the range of 3.25 to 3.75 KV.

While embodiments of an ESD protection device including islands formed of polysilicon or field oxide have been disclosed, the invention is not so limited. ESD protection devices consistent with the present invention can include islands formed as shallow-trench isolation islands in the source and/or drain diffusion regions. Such shallow-trench isolation islands are formed by silicon etching via a nitride mask, followed by thermal oxidation and planarization or formed of an insulation material such as silicon nitride to form silicon nitride islands on the source and/or drain diffusion regions.

Further, consistent with the present invention, islands can be formed of a field oxide portion that has a layer of polysilicon formed thereover. The periphery of the polysilicon preferably extends beyond the edge of the field oxide portion.

In ESD device 900, island 904 can be coupled to either or both of anode 402 and cathode 404. In accordance with further aspects of the present invention, in those embodiments including polysilicon islands formed along the drain diffusion region and that extend beyond the edge of the drain diffusion region, such islands can also be coupled to either or both of the anode and cathode in a manner consistent with that disclosed for ESD device 900.

While embodiments of the present invention have been described as fabricated by a salicide process, the invention is not so limited. ESD protection devices can be fabricated by other process technologies within the scope of the present invention, for example, a non-silicide process.

While embodiments of the present invention include formation of an ESD protection device on a semiconductor substrate, the invention can be practiced with equal effectiveness using a silicon-on-insulator (SOI) substrate.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electronic discharge (ESD) protection device, comprising:
    a semiconductor layer;
    a first diffusion region formed in the layer;
    a second diffusion region formed in the layer adjacent to and spaced apart from the first diffusion region;
    a channel region formed at a boundary between the first and second diffusion regions, wherein said channel region is bounded by first and second diffusion edges of the first diffusion region; and
    at least one island formed at least partially in the first diffusion region, the at least one island being positioned non-symmetrically about a plane perpendicular to a top surface of the semiconductor layer and perpendicular to the boundary, wherein said place bisects the channel region.

2. The ESD protection device of claim 1, wherein the at least one island comprising at least one polysilicon island.

3. The ESD protection device of claim 1, wherein the at least one island comprises at least one field oxide island.

4. The ESD protection device of claim 1, wherein the at least one island comprises at least one shallow trench island.

5. The ESD protection device of claim 1, wherein the at least one island comprises at least one island constructed of insulation material.

6. The ESD protection device of claim 1, wherein the ESD protection device a MOSFET, the first diffusion region is a drain region, and the second diffusion region is a source region;
the device further comprising a gate region overlying a region between the source and drain regions.

7. The ESD protection device of claim 6, wherein the semiconductor layer comprises a layer of silicon formed on an insulating layer to form a silicon-on-insulator (SOI) substrate, so that the MOSFET is formed on the SOI substrate.

8. The ESD protection device of claim 1, wherein the ESD protection device is a bipolar structure, the first diffusion region is a collector region, and the second diffusion region is an emitter region.

9. The ESD protection device of claim 1, wherein the semiconductor layer comprises a silicon substrate.

10. The ESD protection device of claim 1, wherein the semiconductor layer comprises a layer of silicon formed on an insulating layer to form a silicon-on-insulator substrate.

11. The ESD protection device of claim 1, wherein the at least one island comprises a first island and a second island, the first island being substantially longer than the second island and a gap between proximate ends of the first and second islands being near an edge of the first diffusion region.

12. The ESD protection device of claim 11, further including a third island and a fourth island formed along a length direction of the second diffusion region, the third island being substantially longer than the fourth island, the third island being non-symmetrically positioned relative to the first island.

13. The ESD protection device of claim 1, wherein the at least one island comprises a first island and a second island, the first island being substantially longer than the second island and a gap between proximate ends of the first and second islands being near an edge of the first diffusion region, near a first side of the device, along the length direction of the diffusion region; and
further including at least another island formed substantially parallel to the length direction of the first diffusion region along a length direction of the second diffusion region.

14. The ESD protection device of claim 13, wherein the at least another island comprises a third island and a fourth island, the fourth island being substantially longer then the third island, a gap between proximate ends of the third and fourth islands being near an edge of the second diffusion region along the length direction near a second side of the device opposite the first side.

15. The ESD protection device of claim 14, wherein remote ends of the first and third islands are joined by a first connection, remote ends of the second and fourth islands are joined by a second connection, and the first and second connections are connected together.

16. The ESD protection device of claim 12, further including a metal bus overlaying at least a portion of the first and second diffusion regions including the first, second, third, and fourth islands; and
the first, second, third, and fourth islands comprising polysilicon.

17. The ESD protection device of claim 1, wherein the at least one island comprises a single island having one end extending beyond one edge of the first diffusion region end an opposite end proximate an opposite edge of the first diffusion region.

18. The ESD protection device of claim 11, wherein remote ends of the first and second islands extend beyond respective opposite edges of the first diffusion region.

19. The ESD protection device of claim 1, further including at least one island non-symmetrically disposed along a length direction of the second diffusion region.

20. The ESD protection device of claim 1, wherein
said at least one island having a first island edge near said first diffusion edge and a second island edge near said second diffusion edge;
a first gap of at least zero spacing between the first diffusion edge and a first nearest island edge;
a second gap of at least zero spacing between the second diffusion edge and a second nearest island edge; and
said first gap being larger than the second gap.

21. An electrostatic discharge (ESD) protection device, comprising:
a semiconductor layer;
a first diffusion region formed in the layer;
a second and a third diffusion region formed in the layer each adjacent to and spaced apart from the first diffusion region;
a first channel formed at a boundary between the first and second diffusion regions;
a second channel formed at a boundary between the first and third diffusion regions;
a contact array comprising at least one contact formed over the first diffusion region for providing conductive contact to the first diffusion region;
a first group of at least one island disposed in the first diffusion region between the contact array and the first channel;
a second group of at least one island disposed in the first diffusion region between the contact array and the second channel.
wherein said first and second groups include all islands in the first diffusion region and said first end second groups being disposed non-symmetrically about a plane perpendicular to a top surface of the semiconductor layer, wherein the plane extends along the contact array.

22. The ESD protection device of claim 21, wherein the plane is parallel to the boundary between the first and second diffusion regions.

* * * * *